United States Patent
Tseng et al.

(10) Patent No.: US 6,703,713 B1
(45) Date of Patent: Mar. 9, 2004

(54) WINDOW-TYPE MULTI-CHIP SEMICONDUCTOR PACKAGE

(75) Inventors: Wei-Cheng Tseng, Taichung (TW); Chin Te Chen, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/309,478

(22) Filed: Dec. 4, 2002

(30) Foreign Application Priority Data

Sep. 10, 2002 (TW) ........................ 91120549 A

(51) Int. Cl.$^7$ ............................ H01L 23/50; H01L 23/58
(52) U.S. Cl. ........................ 257/777; 257/723; 257/784; 257/787
(58) Field of Search .................... 257/666–796

(56) References Cited

U.S. PATENT DOCUMENTS

| | | | |
|---|---|---|---|
| 6,218,731 B1 | 4/2001 | Huang et al. | 257/738 |
| 6,265,763 B1 * | 7/2001 | Jao et al. | 257/676 |
| 6,281,578 B1 | 8/2001 | Lo et al. | 257/724 |
| 6,396,116 B1 * | 5/2002 | Kelly et al. | 257/432 |
| 6,414,396 B1 | 7/2002 | Shim et al. | 257/778 |
| 6,458,625 B2 * | 10/2002 | Akram | 438/111 |

* cited by examiner

Primary Examiner—Wael Fahmy
Assistant Examiner—Marcos D. Pizarro-Crespo
(74) Attorney, Agent, or Firm—Peter F. Corless; Steven M. Jensen; Edwards & Angell, LLP

(57) ABSTRACT

A window-type multi-chip semiconductor package is provided. A first chip and a second chip are mounted on a surface of a substrate formed with an opening, and a third chip is stacked on the first and second chips, wherein a plurality of bonding wires formed through the opening are used to electrically interconnect the chips and electrically connect the chips to the substrate. The chips are encapsulated by a first encapsulant formed on the surface of the substrate, and a second encapsulant is formed on an opposing surface of the substrate for encapsulating the bonding wires. With the chips being mounted on the same surface of the substrate, conductive elements such as bond pads formed on the chips are arranged toward the same direction and facilitate shortening of the bonding wires, thereby enhancing electrical transmission and performances for the semiconductor package.

17 Claims, 2 Drawing Sheets

WINDOW-TYPE MULTI-CHIP SEMICONDUCTOR PACKAGE

FIELD OF THE INVENTION

The present invention relates to semiconductor packages, and more particularly, to a window-type multi-chip semiconductor package in which a substrate formed with an opening is used as a chip carrier for accommodating a plurality of chips thereon.

BACKGROUND OF THE INVENTION

A window-type semiconductor package employs advanced packaging technology, characterized in the use of a substrate formed with at least an opening penetrating through the same, allowing a chip to be mounted over the opening on the substrate and electrically connected to the substrate by means of a plurality of bonding wires formed through the opening. This structure is beneficial of shortening length of the bonding wires to thereby enhance electrical transmission and performances of the chip.

U.S. Pat. No. 6,218,731 discloses a window-type semiconductor package 1, as shown in FIG. 4, comprising: a substrate 10 formed with an opening 100 penetrating through the substrate 10; a chip 11 mounted on an upper surface 101 of the substrate 10, with bond pads 111 formed on an active surface 110 of the chip 11 being exposed to the opening 100; a plurality of bonding wires 12 formed through the opening 100 and bonded to the bond pads 111 of the chip 11, for electrically connecting the active surface 110 of the chip 11 to a lower surface 102 of the substrate 101; a first encapsulant 13 formed on the upper surface 101 of the substrate 10 for encapsulating the chip 11; a second encapsulant 14 formed on the lower surface 102 of the substrate 10, and filling into the opening 100 for encapsulating the bonding wires 12; and a plurality of solder balls 15 implanted on the lower surface 102 of the substrate 10 at area free of the second encapsulant 14, the solder balls 15 acting as I/O (input/output) ports for electrically connecting the semiconductor package 1 to an external device such as a printed circuit board (PCB, not shown).

In order to improve operational speed and electrical performances, Taiwan Patent Publication No. 407354 discloses a window-type dual-chip semiconductor package 1', as shown in FIG. 5, wherein a chip 11 (hereinafter referred to as "first chip") of the above semiconductor package 1 is stacked with a second chip 16 thereon in a back-to-back manner that a non-active surface 160 of the second chip 16 is attached to a non-active surface 112 of the first chip 11. An active surface 161 of the second chip 16 is opposed to an active surface 110 of the first chip 11, and thus, bond pads 162 formed on the active surface 161 of the second chip 16 are substantially opposed in position to bond pads 111 on the first chip 11; as a result, bonding wires 12' for electrically connecting the bond pads 162 of the second chip 16 to an upper surface 101 of a substrate 10 are much longer than bonding wires 12 for electrically connecting the bond pads 111 of the first chip 11 to the substrate 10. This arrangement thereby leads to significant drawbacks; longer bonding wires 12' would delay electrical transmission for the second chip 16, making the second chip 16 not comparable in operational speed to the first chip 11. Moreover, due to the back-to-back stacking of the first and second chips 11, 16 with conductive elements such as bond pads 111, 162 thereof being opposed in position, customarily referred to as pin-to-pin incompatibility, it is therefore not applicable to stack identical chips.

U.S. Pat. No. 6,281,578 discloses a window-type multi-chip (three-chip) semiconductor package 1", as shown in FIG. 6, wherein a first chip 11 and a second chip 16 are mounted on an upper surface 101 of a substrate 10, and the first and second chips 11, 16 are spaced apart from each other by an opening 100 penetrating through the substrate 10 in a manner that the first and second chips 11, 16 are respectively disposed at opposing sides with respect to the opening 100. A third chip 17 is mounted oil a lower surface 102 of the substrate 10 and over the opening 100, allowing bond pads 171 formed on an active surface 170 of the third chip 17 to be exposed to the opening 100; the exposed bond pads 171 are bonded with bonding wires 12" to electrically connect the third chip 17 to the substrate 10 and the second chip 16. The first chip 11 is also electrically connected to the second chip 16 and the substrate 10 by means of bonding wires 12". Moreover, the substrate 10 may be integrally formed with a plurality of leads 18, which act as 110 ports for electrically connecting the chips 11, 16, 17 to an external device such as PCB (not shown). By the structural arrangement of the semiconductor package 1" with active surfaces 110, 160, 170 of the chips 11, 16, 17 being attached to the substrate 10 in a face-up manner, the above discussed drawbacks rendered by back-to-back chip stacking can thus be eliminated. However, as the chips 11, 16, 17 are separately mounted to different upper and lower surfaces 101, 102 of the substrate 10, bonding wires 12" e.g. for interconnecting the second and third chips 16, 17 are hard to be effectively reduced in length, thereby adversely affecting improvement in electrical transmission.

Other related prior arts, including U.S. Pat. Nos. 6,265,763 and 6,414,396, also provide a window-type multi-chip package structure, but fail to disclose stacking of chips on the same surface of a substrate so as to effectively reduce wire length and enhance electrical performances of the package structure.

SUMMARY OF THE INVENTION

An objective of the present invention is to provide a window-type multi-chip semiconductor package, wherein a plurality of chips are stacked on the same surface of a substrate formed with an opening, and conductive elements such as bond pads formed on the chips are arranged toward the same direction, so as to shorten wire length and enhance electrical transmission as well as improve electrical and operational performances of the semiconductor package.

Another objective of the invention is to provide a window-type multi-chip semiconductor package, which can stack a plurality of chips having centrally-situated bond pads on the same surface of the substrate formed with an opening.

In accordance with the above and other objectives, the present invention proposes a window-type multi-chip semiconductor package, comprises: a substrate having an upper surface and a lower surface opposed to the upper surface, and formed with at least an opening penetrating through the substrate; at least a first chip and a second chip each having an active surface and a non-active surface opposed to the active surface, wherein the active surfaces of the first and second chips are mounted on the upper surface of the substrate respectively at opposing sides with respect to the opening in a manner that the first and second chips protrude from the opposing sides toward each other to leave a gap between the first and second chips, with the gap being smaller in dimension than the opening, allowing bond pads formed on the active surfaces of the first and second chips to be exposed to the opening of the substrate; at least a third chip having an active surface and a non-active surface opposed to the active surface, wherein the active surface of the third chip is mounted on the non-active surfaces of the first and second chips and over the gap, and bond pads formed on the active surface of the third chip are exposed to the gap; a plurality of first bonding wires for electrically connecting the third chip to the first and second chips; a plurality of second bonding wires for electrically connecting the first and second chips to the lower surface of the substrate, a plurality of third bonding wires for electrically connecting the third chip to the lower surface of the substrate; a first encapsulant formed on the upper surface of the substrate, for encapsulating the first, second and third chips; a second encapsulant formed on the lower surface of the substrate and filling into the opening and the gap, for encapsulating the first, second and third bonding wires; and a plurality of solder balls implanted on the lower surface of the substrate at area free of the second encapsulant.

The above semiconductor package provides significant benefits. As the first, second and third chips are all mounted on the upper surface of the substrate in a manner that conductive elements (such as bond pads) formed on the active surfaces of the first, second and third chips are all arranged toward the same direction facing the substrate, it can effectively shorten length of bonding wires for electrically interconnecting the chips and electrically connecting the chips to the substrate, thereby desirably improving electrical and operational performances of the semiconductor package. Moreover, the first, second and third chips may be DRAM (dynamic random access memory) chips having centrally-situated bond pads, such that the semiconductor package provides a package structure to stack three chips with centrally-situated bond pads on the same surface (i.e. the upper surface) of the substrate.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments for a window-type multi-chip semiconductor package proposed in the present invention are described in more detail as follows with reference to FIGS. 1 to 3.

First Preferred Embodiment

Figure 1:
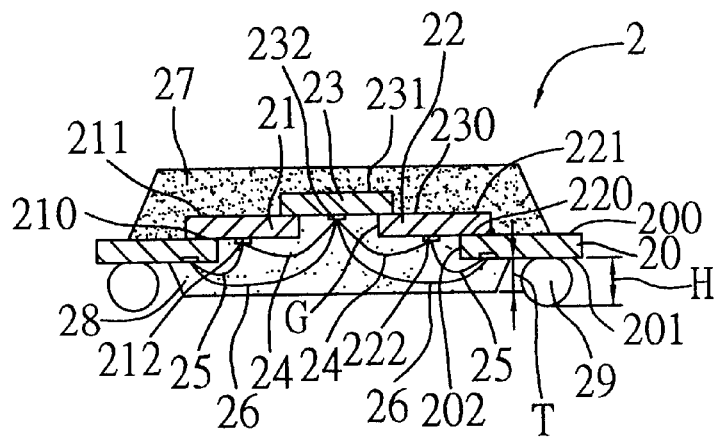
FIG. 1 is a cross-sectional view of a semiconductor package according to a first preferred embodiment of the invention.

FIG. 1 illustrates a window-type multi-chip semiconductor package 2 according to a first preferred embodiment of the invention. As shown in FIG. 1, this semiconductor package 2 utilizes a substrate 20 as a chip carrier. The substrate 20 has an upper surface 200 and a lower surface 201 opposed to the upper surface 200, and is formed with at least an opening 202 penetrating through the upper and lower surfaces 200, 201. The substrate 20 is primarily made of a conventional resin material such as epoxy resin, polyimide, BT resin, FR-4 resin, etc.

At least a first chip 21 and a second chip 22 are prepared, each of which has an active surface 210, 220 formed with a plurality of electronic elements and circuits (not shown) thereon, and a non-active surface 211, 221 opposed to the active surface 210, 220. The first and second chips 21, 22 are mounted with the active surfaces 210, 220 thereof on the upper surface 200 of the substrate 20 respectively at opposing sides with respect to the opening 202 in a manner that the first and second chips 21, 22 protrude from the opposing sides toward each other to leave a gap G between the first and second chips 21, 22, with the gap G being smaller in dimension than the opening 202, so as to allow bond pads 212, 222 formed on the active surfaces 210, 220 of the first and second chips 21, 22 to be exposed to the opening 202 of the substrate 20 and subject to a subsequent wire-bonding process. As shown in FIG. 1, the first and second chips 21, 22 may have centrally-situated bond pads 212, 222, such as DRAM (dynamic random access memory) chips, and the first chip 21 is preferably identical in thickness to the second chip 22.

At least a third chip 23 has an active surface 230 and a non-active surface 231 opposed to the active surface 230. The third chip 23 is stacked on the first and second chips 21, 22, wherein the active surface 230 of the third chip 23 is attached to the non-active surfaces 211, 221 of the first and second chips 21, 22 and over the gap G between the first and second chips 21, 22, so as to allow bond pads 232 formed on the active surface 230 of the third chip 23 to be exposed to the gap G and subject to a subsequent wire-bonding process. As shown in FIG. 1, the third chip 23 may be a DRAM chip having centrally-situated bond pads 232.

A wire-bonding process is performed to form a plurality of first bonding wires 24 such as gold wires through the opening 202 of the substrate 20 and the gap G between the first and second chips 21, 22. The first bonding wires 24 are bonded to the bond pads 232 of the third chip 23 and to the bond pads 212, 222 of the first and second chips 21, 22, to thereby electrically connect the third chip 23 to the first and second chips 21, 22.

A plurality of second bonding wires 25 such as gold wires are formed through the opening 202 of the substrate 20, and bonded to the bond pads 212, 222 of the first and second chips 21, 22 and to bond fingers 203 formed on the lower surface 201 of the substrate 20, so as to electrically connect the first and second chips 21, 22 to the lower surface 201 of the substrate 20 by means of the second bonding wires 25.

A plurality of third bonding wires 26 such as gold wires are formed through the opening 202 of the substrate 20 and the gap G between the first and second chips 21, 22. The third bonding wires 26 are bonded to the bond pads 232 of the third chip 23 and to the bond fingers 203 on the lower surface 201 of the substrate 20, to thereby electrically connect the third chip 23 to the lower surface 201 of the substrate 20.

A first encapsulant 27 is formed by a molding process on the upper surface 200 of the substrate 20, for encapsulating and protecting the first, second and third chips 21, 22, 23 against external moisture and contaminant.

A second encapsulant 28 is formed by a printing process on the lower surface 201 of the substrate 20, and fills into the opening 202 of the substrate 20 and the gap G between the first and second chips 21, 22, so as to encapsulate the first, second and third bonding, wires 24, 25, 26 by means of the second encapsulant 28. The second encapsulant 28 may be made of a resin material different from that for fabricating the first encapsulant 27.

A plurality of solder balls 29 are implanted on the lower surface 201 of the substrate 20 at area free of the second encapsulant 28. Height H of the solder balls 29 is greater than thickness T of the second encapsulant 28 protruding from the lower surface 201 of the substrate 20. The solder balls 29 serve as I/O (input/output) ports of the semiconductor package 2 to electrically connect the first, second and third chips 21, 22, 23 to an external device such as printed circuit board (PCB, not shown).

The above semiconductor package 2 provides significant benefits. As the first, second and third chips 21, 22, 23, are all mounted on the upper surface 200 of the substrate 20, and the bond pads 212, 222, 232 formed on the active surfaces 210, 220, 230 of the first, second and third chips 21, 22, 23 are all arranged toward the same direction facing the substrate 20 (as shown in FIG. 1), it can effectively shorten length of the bonding wires 24, 25, 26 for electrically interconnecting the chips 21, 22, 23 and electrically connecting the chips 21, 22, 23 to the substrate 20, thereby desirably improving electrical and operational performances of the semiconductor package 2. Moreover, the first, second and third chips 21, 22, 23 may be DRAM chips having centrally-situated bond pads 212, 222, 232, such that the semiconductor package 2 provides a package structure to stack three chips with centrally-situated bond pads on the same surface (i.e. the upper surface 200) of the substrate 20.

Second Preferred Embodiment

Figure 2:
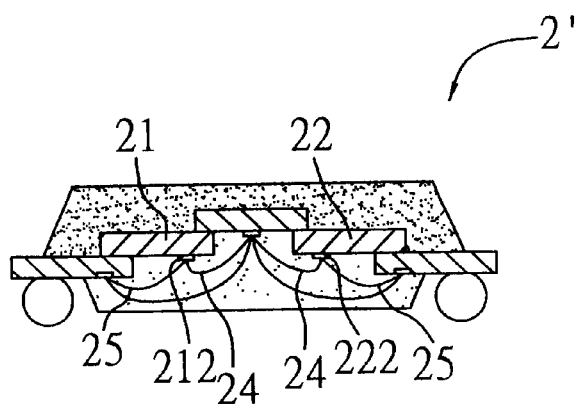
FIG. 2 is a cross-sectional view of a semiconductor package according to a second preferred embodiment of the invention.

FIG. 2 illustrates a semiconductor package 2' according to a second preferred embodiment of the invention. This semiconductor package 2' differs from the above semiconductor package 2 of the first embodiment in that the first hand second chips 21, 22 of the semiconductor package 2' are respectively formed with peripherally-situated bond pads 212, 222, which are exposed to the opening 202 of the substrate 20 to be bonded with the first and second bonding wires 24, 25 respectively. This arrangement increases flexibility in types of chips being suitably adopted in the package structure according to the invention, but not limited to the above-described DRAM chips with centrally-situated bond pads.

Third Preferred Embodiment

Figure 3:
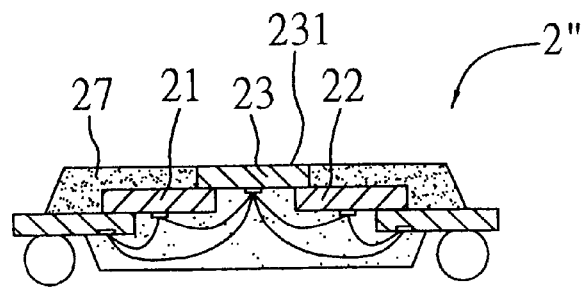
FIG. 3 is a cross-sectional view of a semiconductor package according to a third preferred embodiment of the invention.
Figure 4:
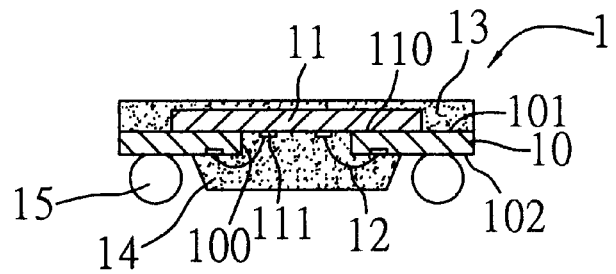
FIG. 4 (PRIOR ART) is a cross-sectional view of a conventional semiconductor package disclosed in U.S. Pat. No. 6,218,731.
Figure 5:
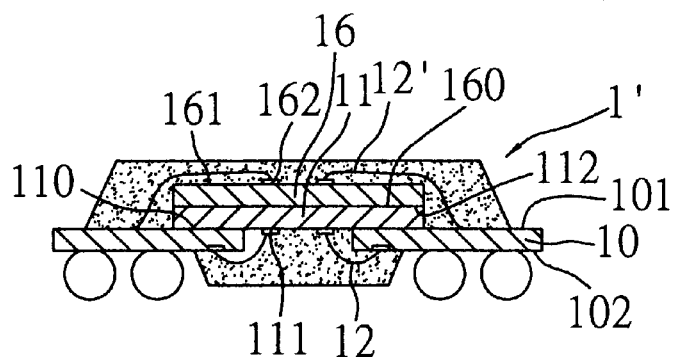
FIG. 5 (PRIOR ART) is a cross-sectional view of a conventional semiconductor package disclosed in Taiwan Patent Publication No. 407354.
Figure 6:
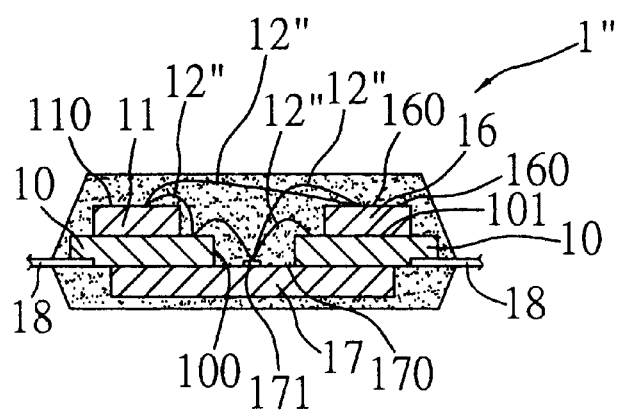
FIG. 6 (PRIOR ART) is a cross-sectional view of a conventional semiconductor package disclosed in U.S. Pat. No. 6,281,578.

FIG. 3 illustrates a semiconductor package 2" according to a third preferred embodiment of the invention. This semiconductor package 2" differs from the above semiconductor package 2 of the first embodiment in that the non-active surface 231 of the third chip 23, in the semiconductor package 2" is exposed to outside of the first encapsulant 27 that encapsulates the first, second and third chips 21, 22, 23. This arrangement allows heat produced from the chips 21, 22, 23 to be effectively dissipated to outside of the semiconductor package 2" by means of the exposed non-active surface 231 of the third chip 23, thereby improving heat dissipating efficiency of the conductor package 2'.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A window-type multi-chip semiconductor package, comprising:
   a substrate having an upper surface and a lower surface opposed to the upper surface, and formed with at least an opening penetrating through the substrate,
   at least a first chip and a second chip each having an active surface and a non-active surface opposed to the active surface, wherein the active surfaces of the first and second chips are mounted on the upper surface of the substrate respectively at opposing sides with respect to the opening in a manner that the first and second chips protrude from the opposing sides toward each other to leave a gap between the first and second chips, with the gap being smaller in dimension than the opening, allowing bond pads formed on the active surfaces of the first and second chips to be exposed to the opening of the substrate;
   at least a third chip having an active surface and a non-active surface opposed to the active surface, wherein the active surface of the third chip is mounted on the non-active surfaces of the first and second chips and over the gap, and bond pads formed on the active surface of the third chip are exposed to the gap;
   a plurality of first bonding wires for electrically connecting the third chip to the first and second chips;
   a plurality of second bonding wires for electrically connecting the first and second chips to the lower surface of the substrate;
   a plurality of third bonding wires for electrically connecting the third chip to the lower surface of the substrate;
   a first encapsulant formed on the upper surface of the substrate, for encapsulating the first, second and third chips;
   a second encapsulant formed on the lower surface of the substrate and filling into the opening and the gap, for encapsulating the first, second and third bonding wires; and
   a plurality of solder balls implanted on the lower surface of the substrate at area free of the second encapsulant.

2. The semiconductor package of claim 1, wherein the bond pads of the first chip are centrally-situated pads.

3. The semiconductor package of claim 1, wherein the bond pads of the first chip are peripherally-situated pads.

4. The semiconductor package of claim 1, wherein the bond pads of the second chip are centrally-situated pads.

5. The semiconductor package of claim 1, wherein the bond pads of the second chip are peripherally-situated pads.

6. The semiconductor package of claim 1, wherein the first chip is identical in thickness to the second chip.

7. The semiconductor package of claim 1, wherein the bond pads of the third chip are centrally-situated pads.

8. The semiconductor package of claim 1, wherein the first bonding wires are bonded to the bond pads of the third chip and to the bond pads of the first and second chips.

9. The semiconductor package of claim 1, wherein the second bonding wires are bonded to the bond pads of the first and second chips and to bond fingers formed on the lower surface of the substrate.

10. The semiconductor package of claim 1, wherein the third bonding wires are bonded to the bond pads of the third chip and to bond fingers formed on the lower surface of the substrate.

11. The semiconductor package of claim 1, wherein the first, second and third bonding wires are gold wires.

12. The semiconductor package of claim 1, wherein the first encapsulant is formed in a molding manner.

13. The semiconductor package of claim 1, wherein the second encapsulant is formed in a printing manner.

14. The semiconductor package of claim 1, wherein the first encapsulant is made of a resin material different from that for the second encapsulant.

15. The semiconductor package of claim 1, wherein the non-active surface of the third chip is exposed to outside of the first encapsulant.

16. The semiconductor package of claim 1, wherein height of the solder balls is greater than thickness of the second encapsulant protruding from the lower surface of the substrate.

17. The semiconductor package of claim 1, wherein the substrate is made of a resin material selected from the group consisting of epoxy resin, polyimide, BT (bismaleimide triazine) resin and FR-4 resin.

* * * * *